United States Patent [19]

Exxon Research and Engineering Co. et al.

[11] Patent Number: 4,546,009
[45] Date of Patent: Oct. 8, 1985

[54] HIGH-MOBILITY AMORPHOUS SILICON DISPLAYING NON-DISPERSIVE TRANSPORT PROPERTIES

[75] Inventors: J. Thomas Tiedje, Garwood; Don L. Morel, Watchung; Benjamin Abeles, Princeton, all of N.J.

[73] Assignee: Exxon Research and Engineering Co., Florham Park, N.J.

[21] Appl. No.: 148,403

[22] Filed: May 9, 1980

Related U.S. Application Data

[63] Continuation-in-part of Ser. No. 80,409, Oct. 1, 1979, abandoned.

[51] Int. Cl.$^4$ .................. B05D 5/12; H01L 31/18
[52] U.S. Cl. .................. 427/39; 136/258; 357/2; 357/30; 357/15; 427/74; 427/84; 427/86
[58] Field of Search .............. 427/39, 74, 82, 84, 427/85, 86; 148/1.5; 136/255, 258 AM; 357/2, 15, 30

[56] References Cited

U.S. PATENT DOCUMENTS 4,064,521 12/1977 Carlson .................. 357/2
4,069,492 1/1978 Pankove et al. .................. 357/17

OTHER PUBLICATIONS

A. R. Moore, "Electron And Hole Drift Mobility In Amorphous Silicon", *Appl. Phys. Lett.*, vol. 31, pp. 762-764 (1977).

W. E. Spear et al., "Investigation Of The Localised State Distribution In Amorphons Si Films", *J. Non-Crystalline Solids*, vols. 8-10, pp. 727-738 W. Fuhs et al., *Physica Status Solidi* B. vol. 89, 495 (1978).

R. Williams et al., "Carrier Generation Recombination & Transport In Amorphous Silicon Solar Cells", *RCA Review*, vol. 40, pp. 371-389 (1979).

J. Jang et al., *Solar Energy Materials*, vol. 7, pp. 377-384 (1982).

B. W. Faughnan et al., *Appl. Phys. Lett.* vol. 44, pp. 537-539 (1984).

D. Allan, *Philosophical Magazine B*, vol. 38, pp. 381-392 (1978).

*Primary Examiner*—Aaron Weisstuch
*Attorney, Agent, or Firm*—Paul E. Purwin; Ronald D. Hantman

[57] ABSTRACT

The present invention teaches a combination of parameters for the glow discharge decomposition of silane deposition of an amorphous silicon semiconductor having non-dispersive high mobility transport of majority carriers through the semiconductor material, useful in switching devices such as diodes, transistors and the like.

11 Claims, 3 Drawing Figures

HIGH-MOBILITY AMORPHOUS SILICON DISPLAYING NON-DISPERSIVE TRANSPORT PROPERTIES

This application is a continuation-in-part of application Ser. No. 080,409, filed Oct. 1, 1979 and now abandoned.

FIELD OF THE INVENTION

The present invention relates to amorphous semiconductor materials, and in particular, to an amorphous silicon semiconductor having increased majority carrier mobility.

BACKGROUND OF THE INVENTION

The vast majority of semiconductor devices such as diodes, transistors and the like utilize a body of crystalline semiconductor material such as silicon and germanium, principally in their single crystal form. Single crystal silicon, though very costly, is the primary semiconductor material for the electronic device industry. Single crystal semiconductor materials such as silicon display a highly symmetrical well-ordered atomic structure resulting in favorable basic electronic properties.

A collective description of the interrelationship of several of the basic properties is referred to in the art as the semiconductor's transport properties. Transport properties generally define the ability of the semiconductor material to move a generated or injected charge carrier through the material. One of the more important components of a material's transport properties is the mobility of the charge carriers. Broadly defined, the mobility determines the rate at which an electron (or hole) will migrate through the semiconductor material under the influence of a given electric field. More particularly, it is the velocity with which the carrier (hole or electron) moves through the material per unit applied field, expressable as $v = \mu E$ where $v$ is the velocity, $\mu$ is the mobility, and $E$ is the electric field. Embodied in a semiconductor device such as a field effect transistor, the mobility is an important factor in determining the switching time of the device.

In the well-ordered atomic structure of single crystal silicon or similar such material, a generated or injected charge carrier will travel rapidly through the material, displaying majority carrier mobility as high as 1,000 cm$^2$/v-sec. These crystalline materials are generally free of localized trapping states in the energy gap, resulting in an uninterfered transit of the charge carriers through the material. If a planar distribution of charge carriers is injected into the aforedescribed high mobility semiconductor, these charge carriers would (under the influence of an electric field) drift uniformly through the semiconductor in a coherent Gaussian packet, which packet would be broadened only by diffusive spreading of the injected charge packet. Furthermore, the time required for the center of said charge packet to travel a specified distance is inversely proportional to the field in the material, provided the field is uniform. This coherent transport of charge carriers, undominated by localized states within the semiconductor, is conventionally referred to as non-dispersive transport. As those of the art readily recognize, semiconductor materials in their natural state do not typically display such favorable electronic characteristics. In the case of single crystals, silicon and germanium required extensive research before the processing techniques produced such an electronically favorable semiconductor material. Those of the art will further recognize that the property influencing techniques for altering semiconductor materials are unique to each individual material.

A relatively new and pioneering field of the semiconductor industry is amorphous semiconductor materials. Unlike their ordered single-crystal counterparts, amorphous semiconductor materials display no long range order. This intrinsic lack of order had conventionally been considered severely detrimental to the electronic transport properties and in particular to mobility of charge carriers. Those of the art had initially considered this a fundamental obstacle in using such materials In semiconductor applications. Amorphous semiconductor materials normally display a substantial density of localized states in the energy gap. These states are conventionally divided into two categories depending on their location in the energy gap and their resultant effect on the transport properties of the semiconductor materials. A first category may be defined as shallow states (less than about 0.2 ev from the band edge) which exhibits relatively short trapping time (less than or equal to about $10^{-9}$ seconds). These shallow states are generally attributed to fluctuations in the local potentials. A second category may be generally referred to as deep states. These states are typically greater than about 0.2 ev from the band edge and trap charge carriers for a relatively long period of time (greater than $10^{-9}$ sec.). The term trapping, as known to those in the art, refers to the influence of the localized states upon a charge carrier. Deep states are generally attributed to impurities or gross defects in the amorphous semiconductor lattice such as unsatisfied or dangling bonds.

Since trapping and detrapping events in shallow states are short relative to a charge carrier transit time over distances likely to be involved in a semiconductor device (greater than 1 micron and less than 100 microns), their general effect is to produce only a net lowering of the mobility and will not alter otherwise non-dispersive transport properties of a semiconductor material. Deep states, however, display trapping and detrapping events which substantially alter the transport properties of a semiconductor material. These deep states cause the aforedescribed packet of uniformly injected charge carriers to spread out or disperse during their transit across the semiconductor material. This phenomena arises from charge carriers remaining in deep states while other charge carriers transit the entire distance of the semiconductor device. Thus, the injected charge carriers end up being dispersed throughout the semiconductor material before reaching the opposite electrode.

Graphically illustrating the aforedescribed properties, FIG. 3 is a conventional representation of results for a time of flight experiment, a known technique for evaluating semiconductor transport properties.

Trace 52 shows the collection of charges with respect to time in a semiconductor material having dispersive transport properties. Dispersive transport properties produce polarization effects, long time constants, and similarly undesirable electronic effects in semiconductor devices.

To more clearly illustrate, assume that a slab of amorphous semiconductor material has electrodes deposited on the two opposing faces. A uniform field is impressed across the material between the two electrodes and a packet of charge carriers is injected into the surface of the semiconductor near one electrode. As the carriers drift across the film, a current is induced in the external or monitoring circuit. As the carriers are collected at the opposing electrode, the current in the external circuit falls off. For a semiconductor material having dispersive transport properties, this fall off of current will be protracted, as illustrated in FIG. 3 as trace 52. In contrast, a semiconductor material having non-dispersive transport properties displays an abrupt drop in the current as the carriers are collected at the opposing electrode, illustrated in FIG. 3 as trace 50.

From the length of time it takes the carriers to reach the back electrode, more commonly referred to in the art as the transit time, one can calculate the carrier mobility utilizing the relationship:

$$\mu = \frac{d^2}{Vt}$$

where
  $\mu$ is the drift mobility, hereinafter mobility;
  d is the semiconductor thickness;
  V is the voltage impressed across the electrodes; and
  t is the transit time.

For disordered materials such as amorphous silicon, which normally exhibit a significant amount of dispersion in the carrier transport, those of the art identify the time of arrival of the leading edge of the charge packet at the opposing electrode as the transit time. This time is indicated in FIG. 3 as $t_e'$. Although this transit time effectively over-estimates the carrier mobility, operationally it is normally the only time that can be identified in dispersive materials which show no well defined fall-off in current. In some cases even the first arrival time of carriers in dispersive materials may not be detectable on a linear scale as is illustrated by trace 52 of FIG. 3. In this situation, those of the art identify the first arrival time from a plot of the log of the current as a function of the log of the time. In contrast, materials which exhibit non-dispersive transport do not experience this difficulty. Instead of basing the mobility on the arrival of the leading edge of the charge packet, one identifies the transit time as the arrival time of the center of the charge packet, which more accurately reflects the true carrier mobility. This transit time is indicated by $t_e$ in FIG. 3. It is well represented by the time at which the transient current drops to about one half its value in the current plateau following the light flash. This definition of the transit time recognized in the art of non-dispersive semiconductors, will be adopted here. A more thorough discussion of one example of non-dispersive charge carrier transport through semiconductor materials, may be found in Canali et al., *Physical Review*, B12, 2265 (1975).

The present invention relates to amorphous silicon whose transport properties have been substantially altered to provide non-dispersive transport of charge carriers through the amorphous semiconductor material, making the material suitable for use in diodes, transistors, detectors, solar cells and other similar such semiconductor devices. The amorphous silicon in thin film form is deposited by the known technique of glow discharge decomposition of silane. A judicious selection of deposition parameters is herein shown to produce a substantially unique electronic semiconductor material having the aforedescribed nondispersive transport properties and relatively high majority carrier mobility.

Prior to the present invention, all amorphous materials with the exception of amorphous selenium and possibly silicon dioxide exhibit dispersive transport at room temperature. See, for example, Pfister & Scher, *Physical Review*, B15, 2062 (1977); Pai, *Journal of Chemical Physics*, 52, 2285 (1970). Tetrahedrally coordinated amorphous network materials such as amorphous silicon, for example, are well known to display dispersive transport of charge carriers; see, for example, Allan et al., *Proceedings of Edinburgh Conference*, 1977, Scher & Montroll, *Physical Review*, B12, 2455 (1975). In contrast, the present invention teaches deposition techniques which produce an unexpected alteration of the conventionally observed transport properties in amorphous silicon.

PRIOR ART

The origin of glow discharge decomposition of silane to produce amorphous silicon is generally attributed to R. C. Chittick et al., reporting their findings in the *Journal of Electrochemical Society*, Vol. 116, No. 1, Jan. (1969). Substantially similar techniques were utilized by Carlson et al. as disclosed in U.S. Pat. Nos. 4,064,521, 4,069,492 and 4,142,195, and further disclosed in the publication "*IEEE Transactions on Electronic Devices*" Vol. 24, No. 4, April, 1977. Numerous others in the art have similarly utilized the technique of glow discharge decomposition of silane to deposit amorphous silicon, describing broad ranges of variant deposition conditions. It is also recognized that amorphous silicon prepared by glow discharge decomposition of silane contains 10–20 wt. % H which gives the material superior electronic properties over unhydrogenated amorphous silicon. Although broad ranges of deposition conditions have been disclosed by those in the art, the particular combination of subsets of these ranges taught by the present invention in conjunction with several deposition parameters heretofore not taught in the art have resulted in the substantially differing amorphous silicon material of the present invention, previously unrealized by those in the art.

Most importantly, the prior art has taught that the amorphous silicon produced by the deposition parameters disclosed therein displays dispersive transport properties and mobilities substantially lower than that of the present invention. For example, W. Fuhs et al. have reported in *Physica Status Solidi*, B, 89, 495 (1978) their analysis of the transport properties of amorphous silicon produced by the aforedescribed methods. These findings verified by others in the art, such as:

1. A. Moore, *Applied Physics Letters*, 31, 762 (1977)
2. W. Fuhs, M. Milleville and J. Stuke, *Physica Status Solidi*, 89, 495 (1978)
3. W. Spear and P. LeComber, *Journal of Non-Crystalline Solids*, 8–10, 727 (1972)

which typify the numerous disclosures of the electronic transport properties of glow discharge produced amorphous silicon. All known prior art teachings support the previously accepted principle that the transport properties of amorphous silicon are dispersive and have relatively low values for majority carrier mobility. In contrast, the present invention provides deposition parameters resulting in an electronically differing amorphous silicon semiconductor having relatively high majority carrier mobilities and displaying non-dispersive transport properties.

SUMMARY

In the glow discharge deposition of amorphous silicon, a combination of deposition parameters results in a substantially unique electron transport mechanism, heretofore unrealized in the art of amorphous silicon semiconductors. Devices constructed utilizing the amorphous silicon of the present invention display non-dispersive electron transport properties having mobilities in excess of about 0.6 cm$^2$/v-sec. When embodied in a semiconductor switching device, the improved semiconductor material will substantially decrease the switching time of the device.

BRIEF DESCRIPTION OF THE DRAWINGS

In the drawings, where identical components are designated by common reference numbers.

DETAILED DESCRIPTION OF THE INVENTION

Figure 1:
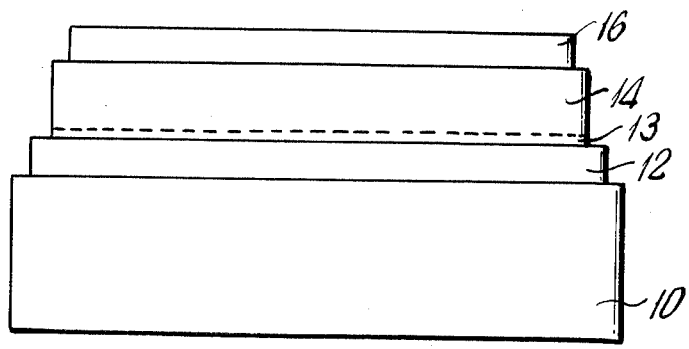
FIG. 1 is a side view of a Schottky diode device having a body of high mobility amorphous silicon.
Figure 2:
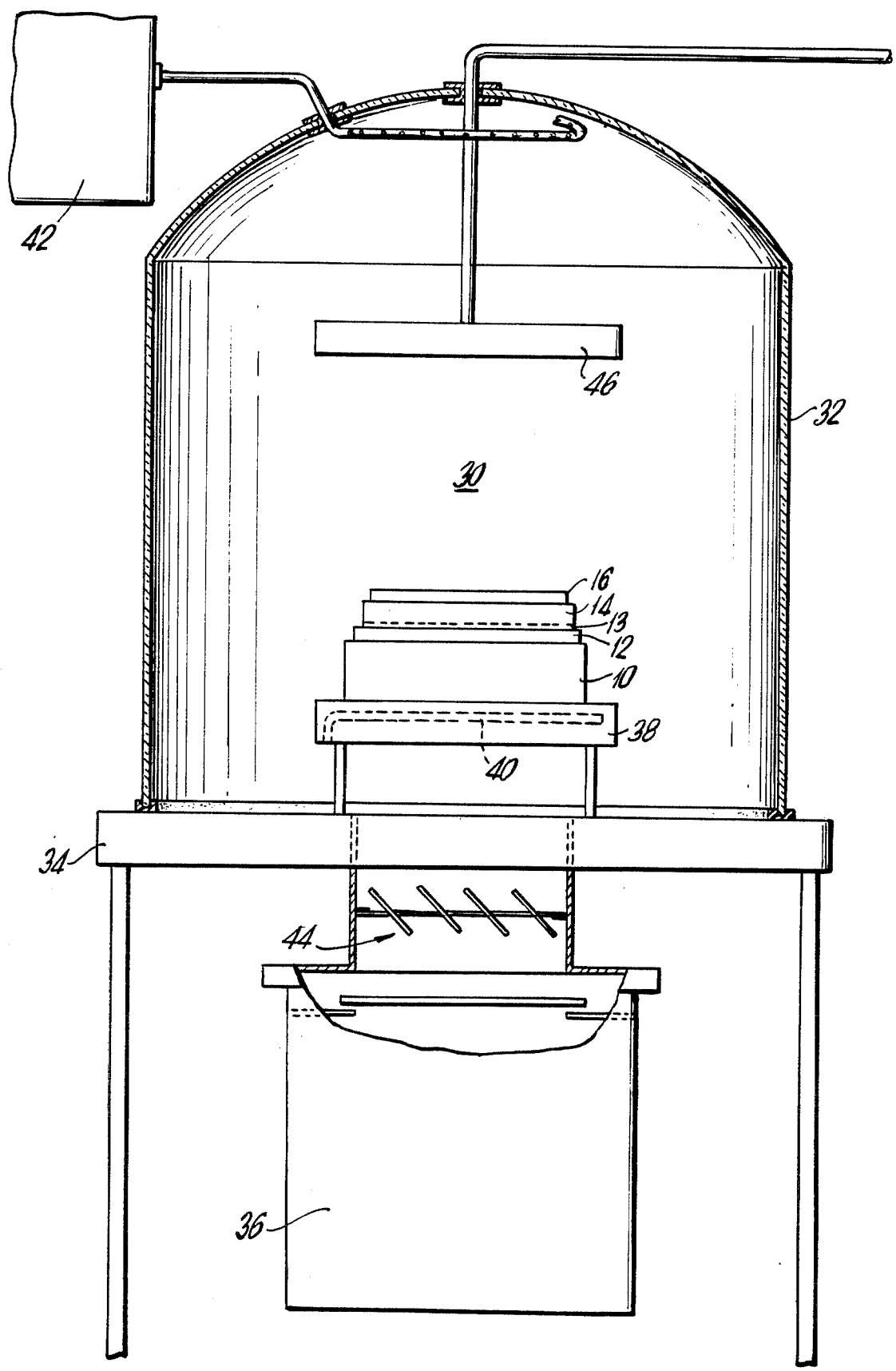
FIG. 2 is a cutaway profile of a glow discharge deposition system for producing films of amorphous silicon.

Referring now to FIG. 1, there is shown the amorphous silicon semiconductor of the present invention embodied in a Schottky diode. The device is constructed by selecting a substrate 10 for deposition of a layer of amorphous silicon thereon. Substrate 10 is sufficiently resilient to provide support to the overlying layers. The substrate 10 must further be capable of withstanding temperatures in excess of about 500° C. The term withstand here requires that the substrate so heated experiences virtually no change in the macroscopic dimensions or microscopic surface characteristics of the substrate. Additionally, the surface of the substrate must be free of surface defects of the order of one micron or larger to prevent discontinuity in the overlying layers. Referring to FIG. 2, where the substrate is to be heated from below during the deposition of the overlying layers, the substrate must be capable of conducting or transmitting a sufficient amount of heat from its lowermost surface to the deposition surface. Referring to FIG. 1, layer 12 comprises a material which will form an ohmic contact to the overlying amorphous silicon. The term ohmic contact generally refers to the ability of an electrode to both extract or inject charge carriers (either electrons or holes) as opposed to blocking contact which will preferentially inject or extract one type of carrier. This layer may comprise the substrate material itself or, alternatively, a thin layer suitable for forming the aforedescribed ohmic contact may be interposed between said substrate and said amorphous silicon layer. It has been generally found that aluminum and antimony form suitable ohmic contacts to intrinsic amorphous silicon at or below the anticipated deposition temperatures. If, however, the initial region of amorphous silicon is doped N+ as described hereinafter, other materials such as chrome and nichrome form ohmic contacts to said doped material. In a preferred embodiment, a 1,000 Angstrom thick layer of nichrome is sputter deposited just prior to the deposition of the overlying N+ doped semiconductor layer. It should be recognized that the vacuum deposition of the several materials described herein may be accomplished in a single deposition apparatus suitably fixtured to accommodate multiple deposition conditions, thus avoiding exposure of the partially constructed device to atmospheric conditions.

Layer 14 comprises the improved amorphous semiconductor material of the present invention. As mentioned heretofore, the semiconductor layer 14 is vacuum deposited by the glow discharge decomposition of silane. As illustrative thereof, in FIG. 2, there is shown a vacuum deposition chamber adapted to provide glow discharge deposition of amorphous silicon. An atmosphere excluding chamber 30 comprises a conventional bell jar 32, base plate 34 and pumping station 36. To minimize incorporation of extrinsic elements in the deposition process, bell jar 32 may be evacuated to advantage to a pressure of below about $10^{-5}$ torr, backfilled with SiH$_4$ and subsequently re-evacuated. This process may be repeated. The aforedescribed substrate 10 having ohmic contact 12 is held continguous to an electrode 38 which for differing depositions techniques to be described hereinafter will either be an anode electrode or a cathode electrode. A heater element 40, here illustrated as embedded within the electrode 38, is capable of sustaining a substrate temperature in excess of about 500° C. Although not shown, substrate 10 need not be positioned contiguous to electrode 38, but may alternatively be positioned within the vicinity of said electrode provided suitable means of substrate heating is provided. Substrate 10 is heated to a temperature between about 220° C. and about 350° C. Conventional thermocouple means (not shown), or alternatively, optical pyrometer means (also not shown) may be used to monitor the temperature of the substrate. Means for sustaining a relatively invariant substrate temperature may be incorporated to advantage. Gaseous silane, SiH$_4$, is bled into the evacuated chamber 30 through metering, mixing and flow control means here collectively illustrated as 42. The pressure of chamber 30 is raised to between about 20 millitorr and about 850 millitorr by controlling the gas feed rate and the vacuum pumping speed.

DC Glow Discharge Deposition

To initiate direct current (hereinafter DC) glow discharge deposition, a DC electropotential of between about 700 volts and about 800 volts is impressed between electrode 38, here a cathode electrode, and electrode 46, here an anode electrode. In a preferred embodiment, an amount of gaseous phosphine may be initially mixed with the silane, said mixture constituting a phosphine to silane ratio between about 0.3 to 100 and about 3.0 to 100. By so doing, the initial layers of amorphous silicon here shown at 13 are doped N+, insuring that the underlying electrode forms an ohmic contact. Typically, the deposition of the N+ region will extend from about 50 Angstroms to about 1000 Angstroms whereafter the supply of phosphine gas is removed and glow discharge decomposition of pure silane produces the intrinsic amorphous silicon layer of the present invention. In the DC mode of glow discharge decomposition of silane, electrons striking the silane molecules both ionize and partially disassociate the molecules. Molecular and atomic species diffuse and drift to the electrode containing the substrate 10. With a gas flow rate of silane regulated at about 10 cm$^3$/min. and the chamber pressure regulated at between 800 millitorr and about 850 millitorr, a glow discharge potential of between about 700 volts and 800 volts impressed across generically cylindrical electrodes having a mean diameter of about 7.6 cm and an inter-electrode spacing of about 2.5 cm produces a discharge current of between about 0.05 milli amps per $cm^2$ and 0.3 milli amps per $cm^2$. Under these deposition conditions a layer of amorphous silicon between about 1 to 5 microns correlates to a deposition rate of between about 4 Angstroms per second and 30 Angstroms per second. For example, if the glow discharge is sustained for a period of between about 5 min. to 20 min., then an amorphous silicon layer will be deposited which is greater than 1 micron in thickness.

R.F. Glow Discharge

An alternative glow discharge deposition process substitutes radio frequency (hereinafter RF) exitation of the discharge. Substrate 10 is secured to electrode 38, which for RF glow discharge is an anode electrode. The substrate is heated to a temperature of between about 220° C. and about 350° C. As described for the previous deposition technique, chamber 30 is evacuated below about $10^{-5}$ torr, back-filled with $SiH_4$ and re-evacuated. As before, this process may be repeated to advantage. Similar to the DC deposition, a preferred embodiment utilizes an amount of gaseous phosphine constituents between about 0.3 and 3% of the gaseous mixture of silane and phosphine to dope the initial layer of amorphous silicon (here shown as 13) N+, ensuring that the underlying electrode forms an ohmic contact. An RF power source, not shown, is connected in power supplying relationship to electrodes 38 and 46. The RF power supply is capable of coupling about 100 watts of power to a glow discharge under the herein-described gas content and gas pressure conditions. The discharge is initiated by either adjusting the pressure of chamber 30 or by providing an auxiliary electric field of sufficient magnitude to initiate ionization, whereafter said discharge is sustained by RF excitation. This ionization phenomenon, commonly referred to as the Pennington effect, is well known to those in the art. After the deposition of an initial 50 to about 500 Angstroms of N+ doped silicon, the phosphine supply is eliminated. A flow rate of pure silane is re-established and the pressure of chamber 30 is maintained at between about 30 millitorr and about 50 millitorr by controlling the vacuum pumping speed, means for which is illustrated at 44. The silane flow rate is proportional to the electrode area and has a value of about 0.05 $cm^3$/min to about 0.06 $cm^3$/min per $cm^2$ of electrode area. Electrode area is defined as the innermost surface area of the anode or cathode electrode. The RF power input during the deposition is maintained between about 0.2 watts/$cm^2$ and about 0.4 watts/$cm^2$ as measured by a conventional watt meter capacitively coupled to the gases contained within the vacuum chamber by means of a pair of generally cylindrical electrodes having a mean diameter of about 8 inches and having an inter-electrode spacing of about 2 inches; this power level, however, is determined by measuring the input power less the reflected power, which does not account for radiated power losses. Under the aforedescribed deposition conditions, a layer of amorphous silicon between about 1 micron and about 3 microns in thickness is deposited in about 80 minutes, which correlates to a deposition rate between about 2 Angstroms per second and about 6 Angstroms per second.

The deposition parameters, as described herein for either DC or RF glow discharge result in an electronically unique semiconductor layer of amorphous silicon nowhere revealed in the art. The unique properties of this material are best described in terms of its fundamental electrical characteristics which is a standard of evaluation common to virtually all semiconductor materials and recognized by those in the art. To facilitate this evaluation of the fundamental properties of the amorphous silicon layer, a blocking or diode junction is formed thereto by depositing a high work function metal 16 onto the amorphous silicon layer. The term high work function is definable as being above the estimated work function of amorphous silicon that is above about 4.5 eV: metals or similar such materials having work functions above this value form diode junctions; however, palladium, having a work function above about 4.8 e.v., has been shown preferable. In an alternative embodiment, a PN junction may be formed by depositing a P-type layer onto the N-type amorphous silicon or similarly doping a region of the previously N-type amorphous silicon rendering said region P-type. An intrinsic layer may be interposed between the P&N layers to advantage.

Figure 3:
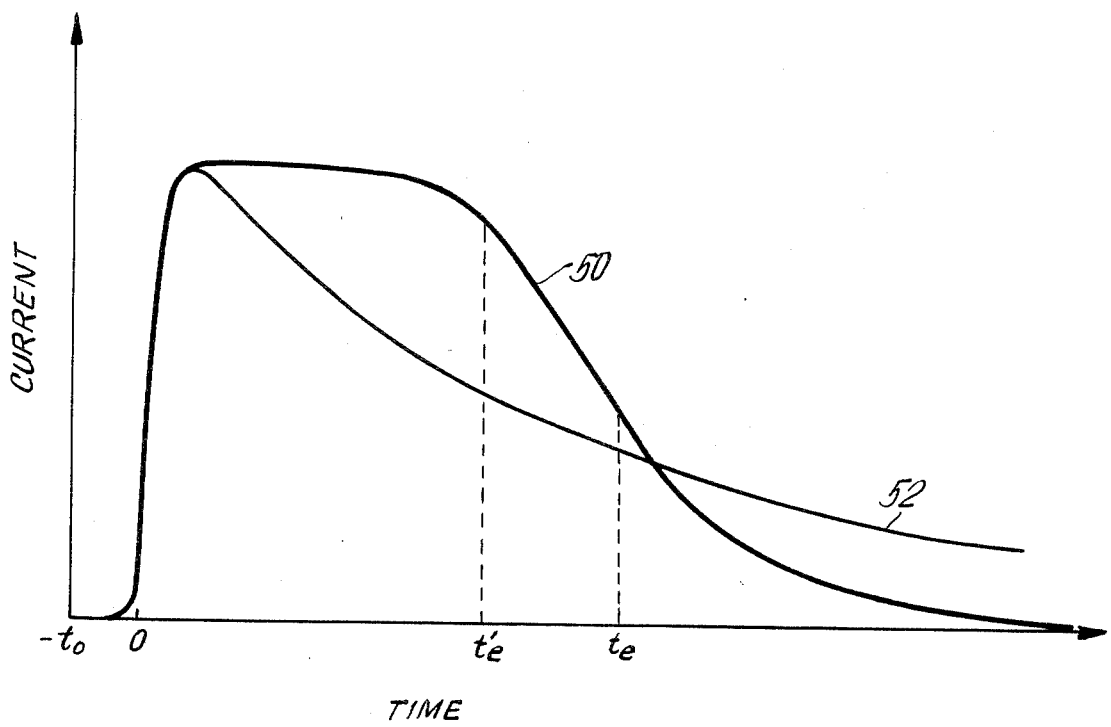
FIG. 3 is a graphic plot of the charge carrier produced current shown as a function of time, displaying the non-dispersive transport properties of the present invention shown in contrast to the prior art dispersive transport properties of amorphous silicon.

A conventional time of flight technique is utilized in the characterization of charge carrier transport properties, providing data on the mobility of majority carrier electron transit through the amorphous silicon layer. Utilizing known techniques, electrons (and holes) are injected at the blocking contact. A short duration (approx. 8 nanoseconds) pulse of laser generated light of a wavelength which is substantially absorbed within about the first 500 Angstroms of the amorphous silicon layer, generates electron hole pairs in the semiconductor at or near the diode junction. A pulsed electric field of known magnitude and duration is impressed across the amorphous silicon layer. Under the influence of this known field, injected electrons drift or migrate through the amorphous silicon semiconductor layer to be collected at the opposing electrode. Electrons drifting through the semiconductor material induce a current in the external circuit. This current is displayed in FIG. 3 as a function of time. Referring to trace 50 of FIG. 3, at time equal to $-t_o$ the field pulse is initiated. Shortly thereafter, here shown at time equal to zero, a packet of charge carriers are injected at or near the surface of the amorphous silicon layer. The time $t_o$ should be short relative to the dielectric relaxation time of the material defined by $t_d = \rho\epsilon$, where $\epsilon$ is the dielectric constant of the material and $\rho$ is its resistivity. This ensures that the externally applied field is applied uniformly across the material. The charges traversing a known thickness of amorphous silicon produce a current I, shown on the vertical axis and plotted against elapsed time, shown on the horizontal axis. The fall-off of current here shown at $t_e$ defines the transit time of charge carriers across the known distance of amorphous semiconductor material. The transit time indicated at $t_e$ in FIG. 3 is the time of arrival of the center of the charge packet at the opposing electrode. The mobility of these charge carriers (here the majority electron carriers) is defined by the relationship: $\mu = d^2 / V t_e$ where $\mu$ is the mobility of electrons, d is the thickness of the amorphous silicon layer, V is the voltage applied across the silicon layer, and $t_e$ is the electron transit time. As those skilled in the art further recognize, trace 50 represents the transport of charge carriers in a relatively coherent Gaussian packet, indicating a semiconductor transport mechanism generally known as, and herein defined to be nondispersive transport of charge carriers. Trace 50 is similar to the corresponding transient current observed in high mobility nondispersive single crystal materials such as crystalline silicon. Curve 50 is broadened only in response to the diffusive spreading of the injected charge packet. Trace 52, in contrast, is the transport properties of charge carriers in amorphous silicon not produced in accordance with the present invention. Trace 52 is representative of the dispersive transport mechanism predicted by and, prior to this invention, reported by those of the art.

As is presently understood, the combination of deposition parameters selected in accordance with this invention results in an improved amorphous silicon semiconductor having nondispersive transport of majority carriers through the semiconductor material. This preferred transport mechanism results in a substantially greater mobility of majority carriers through the semiconductor, enabling the semiconductor to be used in improved switching speed electronic devices. The mobility measured for amorphous silicon produced in accordance with the present invention is in excess of 0.6 cm$^2$/v-sec for films prepared by D.C. glow discharge means and in excess of 0.9 cm$^2$/v-sec for films prepared by RF glow discharge means. This value of the mobility is determined from the transit time of the center of a charge packet in accordance with the generally accepted practice for nondispersive conductors.

EXAMPLE 1

A plurality of Corning-type 7059 borosilicate glass substrates were scrupulously cleaned to remove microscopic debris from the major surfaces of substrate. The cleaned substrates were placed in a conventional sputtering apparatus wherein a layer of about 1000 Angstroms of nichrome metal was deposited over a major portion of one side of the substrates. The substrates were transferred to a glow discharge deposition apparatus, similar to that illustrated in FIG. 2 of the drawings. The deposition apparatus included a Pyrex Bell jar about 30 cm high and about 15 cm in diameter held in vacuum contact to a stainless steel baseplate by interposing a Vycor gasket therebetween. A pumping station comprising selectably alternative pumping means of mechanical pumping, diffusion pumping, or turbo-molecular pumping, is utilized to evacuate the deposition chamber. Pumping speed is controlled by selectively varying the opening and closing of an aperture between the pumping station and the deposition chamber. An anode electrode comprising a 7.6 cm diameter circular disc of stainless steel, approximately 0.6 cm in thickness, has a plurality of resistive heating elements embedded within the electrode. The heaters are connected to a conventional temperature controller, capable of maintaining a relatively constant ($\pm 2°$ C.) temperature of the electrode. The substrates may be secured to the heater/cathode electrode by simple mechanical means so long as electrical contact is assured between the cathode electrode and the electrodes on the substrate. A second electrode, the anodic electrode, of similar size and composition is positioned parallel to the cathode electrode and having an inter-electrode spacing of about 2.5 cm. After evacuating the deposition chamber, CCD grade silane is bled into the chamber. In a preferred embodiment, silane is bled into the chamber while concurrently pumping to evacuate same, purging the chamber of residual atmospheric gases. Gaseous silane, $SiH_4$ containing about 1% phosphine, $PH_3$, is bled into the evacuated deposition chamber. A gas mixing and control system, constructed by Navtek Corp., provides precise mixing and control of gas flow rates. The initial gas flow mixture of silane and phosphine was regulated at 10 standard cm$^3$/min. The pumping speed was regulated to provide a deposition chamber pressure of about 850 millitorr. A constant current DC power supply is connected in power supplying relation to the anode and cathode electrode, respectively. A potential of about 750 volts is applied between the anode and cathode electrode, maintaining a cathode voltage of about 850 volts with respect to ground and maintaining an anode voltage of about 100 volts with respect to ground. The electric field impressed between the electrodes both decomposes and ionizes the gas content of the chamber in a conventional glow discharge manner. After a deposition period of about 45 seconds which deposits a phosphine doped N+ layer of amorphous silicon about 700Å in thickness, the supply of phosphine was removed and the system was effectively purged to remove any residual $PH_3$. Pure silane is then fed into the system at a controlled flow rate of about 10 standard cm$^3$/min. The deposition of intrinsic amorphous silicon continues for a period of about 15 minutes to deposit an intrinsic layer about 1.5 microns in thickness. A counter electrode comprising about 100Å of palladium is deposited on top of the amorphous silicon to form a Schottky junction thereto. For experimental purposes, the palladium electrode is kept sufficiently thin to permit light transparency therethrough.

The absorption and reflective characteristics of both the amorphous silicon and the overlying palladium layer were examined using a Cary Model 17 spectrophotometer. The optical characteristics of the palladium film indicated an average white light transmittance of about 30%. The optical characteristics of the amorphous silicon film indicated a band gap of about 1.8 ev.

A conventional time of flight measurement was conducted on the diode device. A pulsed laser provided an 8 nanosecond pulse width irradiation of the palladium contact with 50 Nano-joules of 4,000Å light, which is substantially absorbed within the first 400Å of amorphous silicon. A known quantum efficiency (obtained from other measurements) is used to calculate the number of charges injected into the region at or near the palladium electrode. A pulsed electric field is impressed across the amorphous silicon layer by applying a known voltage V between the palladium and nichrome electrodes. The electric field is initiated just before the light pulse and is of sufficient duration to examine the transit of virtually all injected charges, yet shorter than the dielectric relaxation time of the amorphous silicon. A high speed oscilloscope monitors the collection of charges at the ohmic contact with respect to time. A representative curve is shown in FIG. 3, trace 50, where the transit time $t_e$ about equal to 60 nanoseconds. A best fit comparison of the data points of trace 50 as compared with known non-dispersive carrier transport data shows that less than 10% of the charge carriers exhibited dispersive transport.

EXAMPLE 2

Example 2 is substantially similar to Example 1 in the general arrangement of the deposition chamber, pumping station, and gas feed control system, except for the dimension changes recited hereinafter. Preparation of the substrate and the ohmic contact electrode is similarly identical, as is the vacuum pumpdown procedure.

In Example 2, R. F. excitation of the glow discharge is substituted for the D. C. excitation of Example 1, along with several corresponding changes in deposition parameters. Accordingly, R. F. power is coupled from a conventional R. F. generator operated at about 13.56 megahertz through a matching network in power supplying relationship to a pair of 8-inch diameter electrodes positioned within the deposition chamber. The electrodes are substantially similar to Example 1, except that the interelectrode space is about 2 inches. Furthermore, the R. F. power supply is coupled such that the substrate securing electrode is an anode electrode and the anode need not be electrically coupled to the substrate's nichrome electrode.

Subsequent to pumpdown and purge procedures described heretofore in Example 1, high purity silane is bled into the deposition chamber at a rate of about 20 $cm^3$/min, or stated in terms of electrode surface area, a flow rate of silane of about 0.05 $cm^3$/min per $cm^2$ to about 0.06 $cm^3$/min per $cm^2$ of electrode area, and the pumping speed is regulated to sustain a chamber pressure of about 30 millitorr. The temperature of the substrate is maintained at about 250° C. As described in Example 1, the initial layers contiguous to the nichrome electrode may be doped with about 1.0% phosphine to ensure the ohmicity of the contact. In the deposition of the intrinsic layers of amorphous silicon, the R.F. power supply capacitively couples about 90 watts of R.F. energy to the plasma at a frequency of 13.56 megahertz. It should be noted that the R.F. power was measured by a conventional wattmeter which measures the power input to the deposition system less the amount of reflected power, that is, radiated power loss is not included in this measurement. In the R.F. mode the cathode electrode is self-biased by the glow discharge, attaining a negative voltage of about 460 volts. Under these deposition conditions, a 1.0 micron thick film of amorphous silicon is deposited in about 30 minutes, corresponding to a deposition rate of about 5Å/second.

In a manner identical to Example 1, a semitransparent layer of palladium is deposited onto the amorphous silicon, forming a Schottky junction thereto. The device was subjected to the same electronic and optical evaluation tests as described in Example 1. The R.F. discharge produced device displayed non-dispersive transport having a majority carrier (electron) mobility about equal to 0.9 $cm^2$/v-sec.

EXAMPLE 3

A thin film transistor structure was fabricated having a body of amorphous silicon prepared in accordance with the deposition parameters set forth in Examples 1 and 2. A general description of the structure and the theory of operation of a thin film transistor may be found in for example: "The Insulated-Gate Thin Film Transistor" by P. K. Weimer in "Physics of Thin Films", Vol. 2, pp. 147 (1964). Accordingly, a heavily doped N type crystalline silicon wafer served both as the substrate and gate electrode of the thin film transistor. A 1000Å thick layer of oxide grown on top of the Si wafer by conventional thermal oxidation served as the insulating dielectric. A portion of the oxide layer was etched away using hydrofluoric acid to expose the crystalline silicon and the wafer was cleaned using standard semiconductor substrate cleaning procedures. The substrate was then covered with a suitable masking device having a plurality of openings 8 mm long, 0.2 mm wide, and spaced apart 1 mm. The mask was positioned such that the openings were only over the remaining oxide film. The substrate and mask were then placed into a conventional vacuum evaporator. 1000Å of Cr metal were deposited by thermal evaporation at a rate of about 5Å per second from a chrome plated tungsten rod. The substrate was held at approximately room temperature.

Without moving the mask, the substrate and mask were then transferred to the aforedescribed plasma deposition chamber approximately 500Å of $N^+$- amorphous silicon (doped with $PH_3$) was deposited on top of the Cr fingers using the method described in the foregoing Examples 1 and 2.

The chrome/$N^+$ amorphous silicon conductive strips serve interchangeably as the source and drain electrodes of the thin film transistor. The spacing between the fingers, which is 1 mm, defines the channel length of the transistor.

The plasma chamber was opened, the mask removed from the substrate and replaced by another mask which covered the exposed crystalline silicon of the substrate and about 1 mm of the chrome/$N^+$ amorphous silicon fingers. Approximately 1 micron of intrinsic amorphous silicon was then deposited over the remainder of the substrate. The deposition parameters were essentially identical to those set forth in the foregoing Example 2. The width of the contact between the chrome/$N^+$ amorphous silicon fingers and the intrinsic amorphous silicon layer was therefore approximately 7 mm and defines the channel width of the thin film transistor.

The completed thin film transistor structure was removed from the plasma unit and electrical contact was made to the gate, source, and drain electrodes. The thin film transistor was tested for its characteristics using conventional current-voltage evaluation techniques. The current voltage characteristics of the thin film transistor were obtained using conventional equipment and techniques.

The ratio of the off-resistance to the on-resistance of the device was greater than one thousand. The results demonstrated a switching speed in the dark of less than about 20 ms and a switching speed when illuminated of less than about 5 ms for drain source potential difference of seven volts. The switching time is consistent with the independently measured mobility of the amorphous silicon.

What is claimed is:
1. A method for producing an amorphous silicon semiconductor having nondispersive transport of majority carriers and further having a majority carrier mobility higher than about 0.6 $cm^2$/volt-second, said method comprising the steps of:
providing a substrate for deposition of said silicon thereon;
heating said substrate to a temperature between about 220° C. and about 350° C. in a vacuum chamber;
providing a partial pressure of silane in said chamber between about 800 millitorr and 850 millitorr;
sustaining a direct current glow discharge in the vicinity of said heated substrate at a current density between about 0.05 mA/$cm^2$ and about 0.3 mA/$cm^2$ for a period of time sufficient to deposit a layer of an amorphous silicon semiconductor on said substrate.

2. A method for producing an improved amorphous silicon semiconductor switching device comprising the steps of: providing a substrate for the deposition of said amorphous silicon thereon;

heating said substrate to a temperature between about 220° C. and about 350° C. in a vacuum chamber;

providing a partial pressure of silane in said chamber between 800 millitorr and 850 millitorr;

sustaining a direct current glow discharge at a current density between about 0.05 mA/cm$^2$ and 0.3 mA/cm$^2$ in the vicinity of said substrate for a period of time sufficient to deposit a layer of amorphous silicon thereupon;

forming a diode junction comprising said amorphous silicon layer whereupon majority carriers injected into or generated within said semiconductor are nondispersively transported through said material under the influence of an electric field at a mobility above about 0.6 cm$^2$/volt-second, increasing the switching speed of said device.

3. The method set forth in claims 1 or 2 wherein said partial pressure of silane is maintained between about 800 millitorr and about 850 millitorr by providing a feed rate of gaseous silane of about 10 standard cm$^3$/min and concurrently evacuating said chamber at a rate sufficient to maintain said pressure.

4. The method set forth in claim 3 wherein said glow discharge is sustained by providing a voltage between a generally cylindrical anode and cathode electrode situated in said evacuated chamber, said voltage being between about 700 volts to about 800 volts for a cathode to anode spacing of about 2.5 cm, said anode or cathode having a diameter about equal to about 7.6 cm.

5. The method of claim 4 wherein said glow discharge is sustained for a period of between about 5 min. to 20 min. to deposit an amorphous silicon layer greater than 1 micron in thickness.

6. A method for producing an improved amorphous silicon semiconductor having nondispersive majority carrier mobilities higher than about 0.9 cm$^2$/v-sec, said method comprising the steps of:

providing a substrate for the deposition of said amorphous silicon thereupon;

heating said substrate to a temperature between about 220° C. and about 350° C. in a vacuum chamber previously evacuated to a pressure below about 10$^{-5}$ torr;

providing a partial pressure of silane in said chamber, said partial pressure of silane being between about 30 millitorr and about 50 millitorr;

sustaining a radio frequency glow discharge having an input power between about 0.2 watts/cm$^2$ and about 0.4 watts/cm$^2$ coupled to at least said silane by means of at least two electrodes, said discharge being sustained in a vicinity of said heated substrate and for a time sufficient to deposit a layer of amorphous silicon.

7. A method for producing an improved amorphous silicon semiconductor switching device having non-dispersive electron mobilities greater than about 0.9 cm$^2$/volt-second, said device constructed by the process comprising:

providing a substrate for the deposition of amorphous silicon thereon;

heating said substrate to a temperature between about 220° C. and about 350° C.;

providing a partial pressure between about 30 millitorr and about 50 millitorr of silane in a vacuum chamber previously evacuated to a pressure below about 10$^{-5}$ torr; sustaining a radio frequency glow discharge at a power between about 0.2 watts/cm$^2$ and 0.4 watts/cm$^2$ coupled to at least said silane by means of at least two electrodes, said discharge being sustained in a vicinity of said substrate for a period of time sufficient to deposit a layer of amorphous silicon thereupon;

forming a diode junction comprising said amorphous silicon layer whereupon majority carriers injected into or generated within said semiconductor are non-dispersively transported through said material under the influence of an electric field at a mobility above about 0.9 cm$^2$/volt-second, increasing the switching speed of said device.

8. The method set forth in claims 6 or 7 wherein said electrodes comprise two generally cylindrical electrodes spaced in generally parallel relationship having an inter-electrode spacing of about 2 inches and each having a mean diameter of about 8 inches.

9. The method set forth in claim 8 wherein one of said electrodes is a cathode and said heated substrate is held contiguous to said cathode electrode.

10. The method of claim 9 wherein said glow discharge is sustained at a R.F. power frequency about equal to 13.56 megahertz.

11. The method of claim 8 wherein a relationship between a flow rate of silane input to said chamber and said electrodes is expressed as a gas feed rate of about 0.05 cm$^3$/min to about 0.06 cm$^3$/min per cm$^2$ of electrode area, said electrode area being defined as a surface area of one of said two electrodes and said surface comprising an interelectrode facing surface.

* * * * *